United States Patent
Nishio et al.

(10) Patent No.: US 10,529,558 B2
(45) Date of Patent: Jan. 7, 2020

(54) SEMICONDUCTOR DEVICE, SUBSTRATE, METHOD FOR MANUFACTURING SEMICONDUCTOR DEVICE, AND METHOD FOR MANUFACTURING SUBSTRATE

(71) Applicant: KABUSHIKI KAISHA TOSHIBA, Minato-ku (JP)

(72) Inventors: Johji Nishio, Machida (JP); Tatsuo Shimizu, Shinagawa (JP); Mitsuhiro Kushibe, Setagaya (JP)

(73) Assignee: KABUSHIKI KAISHA TOSHIBA, Mintao-ku (JP)

( * ) Notice: Subject to any disclaimer, the term of this patent is extended or adjusted under 35 U.S.C. 154(b) by 0 days.

(21) Appl. No.: 16/055,300

(22) Filed: Aug. 6, 2018

(65) Prior Publication Data

US 2019/0244812 A1    Aug. 8, 2019

(30) Foreign Application Priority Data

Feb. 7, 2018  (JP) .................................. 2018-020475

(51) Int. Cl.
*H01L 21/02*   (2006.01)
*H01L 29/16*   (2006.01)
*H01L 21/04*   (2006.01)

(52) U.S. Cl.
CPC .. *H01L 21/02378* (2013.01); *H01L 21/02447* (2013.01); *H01L 21/02529* (2013.01);
(Continued)

(58) Field of Classification Search
CPC ......... H01L 21/02378; H01L 21/02579; H01L 21/0465; H01L 21/02576; H01L 21/02529; H01L 21/02447; H01L 29/1608
See application file for complete search history.

(56) References Cited

U.S. PATENT DOCUMENTS 4,885,614 A * 12/1989 Furukawa ......... H01L 21/02381
                                                            257/76
9,716,006 B2    7/2017 Hamada et al.
(Continued)

FOREIGN PATENT DOCUMENTS

JP         11-312686           11/1999
JP      2010278259 A  * 12/2010
(Continued)

OTHER PUBLICATIONS

A. Goryu, et al., "The evaluation of the stress effect for stacking fault in 4H—SiC," The 78$^{th}$ JSAP Autumn Meeting, The Japan Society of Applied Physics, 2017, 3 Pages (with English Translation).

(Continued)

*Primary Examiner* — Sitaramarao S Yechuri
(74) *Attorney, Agent, or Firm* — Oblon, McClelland, Maier & Neustadt, L.L.P.

(57) ABSTRACT

According to one embodiment, a semiconductor device includes a first semiconductor region including a first compound including silicon and carbon, and a second semiconductor region including a second compound including silicon and carbon. The first semiconductor region includes first to third regions contacting the second semiconductor region. The third region is positioned between the first region and the second region. The first region and the second region include germanium. The third region does not include germanium, or a concentration of germanium in the third region is lower than a concentration of germanium in the first region and lower than a concentration of germanium in the second region.

12 Claims, 7 Drawing Sheets

(52) U.S. Cl.
CPC .. *H01L 21/02576* (2013.01); *H01L 21/02579* (2013.01); *H01L 21/0465* (2013.01); *H01L 29/1608* (2013.01)

(56) References Cited

U.S. PATENT DOCUMENTS

| | | | |
|---|---|---|---|
| 9,847,334 B1* | 12/2017 | More | H01L 27/0924 |
| 2007/0032053 A1 | 2/2007 | Seki et al. | |
| 2008/0042209 A1* | 2/2008 | Tan | H01L 21/84 |
| | | | 257/369 |
| 2014/0027814 A1* | 1/2014 | Pfirsch | H01L 29/0834 |
| | | | 257/139 |

FOREIGN PATENT DOCUMENTS

| | | |
|---|---|---|
| JP | 4857697 | 1/2012 |
| JP | 4874527 | 2/2012 |
| JP | 2014-017326 | 1/2014 |
| JP | 2014017326 A * | 1/2014 |
| JP | WO 2016/017215 A1 | 2/2016 |

OTHER PUBLICATIONS

Akira Murata, et al., "Short minority carrier lifetimes in Al- and (Al+B)-doped p-type epilayers for p-type 4H—SiC recombination enhancing layer," The 4th Meeting on Advanced Power Semiconductors, 2017, 5 Pages (with English Translation).

\* cited by examiner

SEMICONDUCTOR DEVICE, SUBSTRATE, METHOD FOR MANUFACTURING SEMICONDUCTOR DEVICE, AND METHOD FOR MANUFACTURING SUBSTRATE

CROSS-REFERENCE TO RELATED APPLICATIONS

This application is based upon and claims the benefit of priority from Japanese Patent Application No. 2018-020475, filed on Feb. 7, 2018; the entire contents of which are incorporated herein by reference.

FIELD

Embodiments described herein relate generally to a semiconductor device, a substrate, a method for manufacturing the semiconductor device, and a method for manufacturing the substrate.

BACKGROUND

For example, there is a semiconductor device that uses a substrate including silicon carbide (SiC). It is desirable for the semiconductor device to have few defects.

DETAILED DESCRIPTION

Figure 1A:
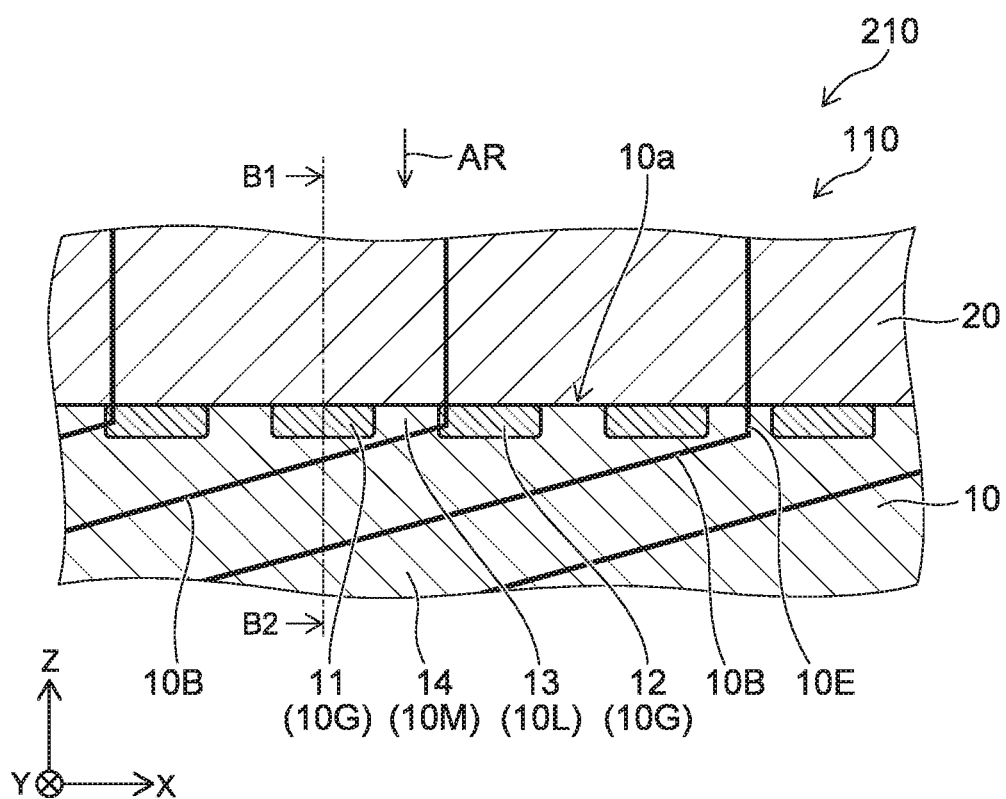
FIG. 1A and FIG. 1B are schematic views illustrating a substrate and a semiconductor device according to the first embodiment.

According to one embodiment, a semiconductor device includes a first semiconductor region including a first compound including silicon and carbon, and a second semiconductor region including a second compound including silicon and carbon. The first semiconductor region includes first to third regions contacting the second semiconductor region. The third region is positioned between the first region and the second region. The first region and the second region include germanium. The third region does not include germanium, or a concentration of germanium in the third region is lower than a concentration of germanium in the first region and lower than a concentration of germanium in the second region.

According to another embodiment, a semiconductor device includes a first semiconductor region including a first compound including silicon and carbon, and a second semiconductor region including a second compound including silicon and carbon. The first semiconductor region includes first to fourth regions. The first to third regions are positioned between the fourth region and the second semiconductor region. The second region is separated from the first region in a direction crossing a direction from the fourth region toward the second semiconductor region. The third region is positioned between the first region and the second region. The first region and the second region include germanium. The third region does not include germanium, or a third peak concentration of germanium in the third region is lower than a first peak concentration of germanium in the first region and lower than a second peak concentration of germanium in the second region. The fourth region does not include germanium, or a fourth peak concentration of germanium in the fourth region is lower than the first peak concentration and lower than the second peak concentration. A concentration of germanium in a portion of the second semiconductor region is $\frac{1}{10}$ of the first peak concentration or more.

According to another embodiment, a substrate includes a first semiconductor region including a first compound including silicon and carbon, and a second semiconductor region including a second compound including silicon and carbon. The first semiconductor region includes first to third regions contacting the second semiconductor region. The third region is positioned between the first region and the second region. The first region and the second region include germanium. The third region does not include germanium, or a concentration of germanium in the third region is lower than a concentration of germanium in the first region and lower than a concentration of germanium in the second region.

According to another embodiment, a substrate include a first semiconductor region including a first compound including silicon and carbon, and a second semiconductor region including a second compound including silicon and carbon. The first semiconductor region includes first to fourth regions. The first to third regions are positioned between the fourth region and the second semiconductor region. The second region is separated from the first region in a direction crossing a direction from the fourth region toward the second semiconductor region. The third region is positioned between the first region and the second region. The first region and the second region include germanium. The third region does not include germanium, or a third peak concentration of germanium in the third region is lower than a first peak concentration of germanium in the first region and lower than a second peak concentration of germanium in the second region. The fourth region does not include germanium, or a fourth peak concentration of germanium in the fourth region is lower than the first peak concentration and lower than the second peak concentration. A concentration of germanium in a portion of the second semiconductor region is $\frac{1}{10}$ of the first peak concentration or more.

According to another embodiment, a method for manufacturing a semiconductor device is disclosed. The method can include preparing a first semiconductor region including a first compound including silicon and carbon. The first semiconductor region includes first to third regions. The third region is positioned between the first region and the second region. The first region and the second region include germanium. The third region does not include germanium, or a concentration of germanium in the third region is lower than a concentration of germanium in the first region and lower than a concentration of germanium in the second region. In addition, the method can include forming, on the first to third regions, a second semiconductor region including a second compound including silicon and carbon.

According to another embodiment, a method for manufacturing a substrate is disclosed. The method can include preparing a first semiconductor region including a first compound including silicon and carbon. The first semiconductor region includes first to third regions. The third region is positioned between the first region and the second region. The first region and the second region include germanium. The third region does not include germanium, or a concentration of germanium in the third region is lower than a concentration of germanium in the first region and lower than a concentration of germanium in the second region. In addition, the method can include forming a second semiconductor region including a second compound including silicon and carbon on the first to third regions.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 1B:
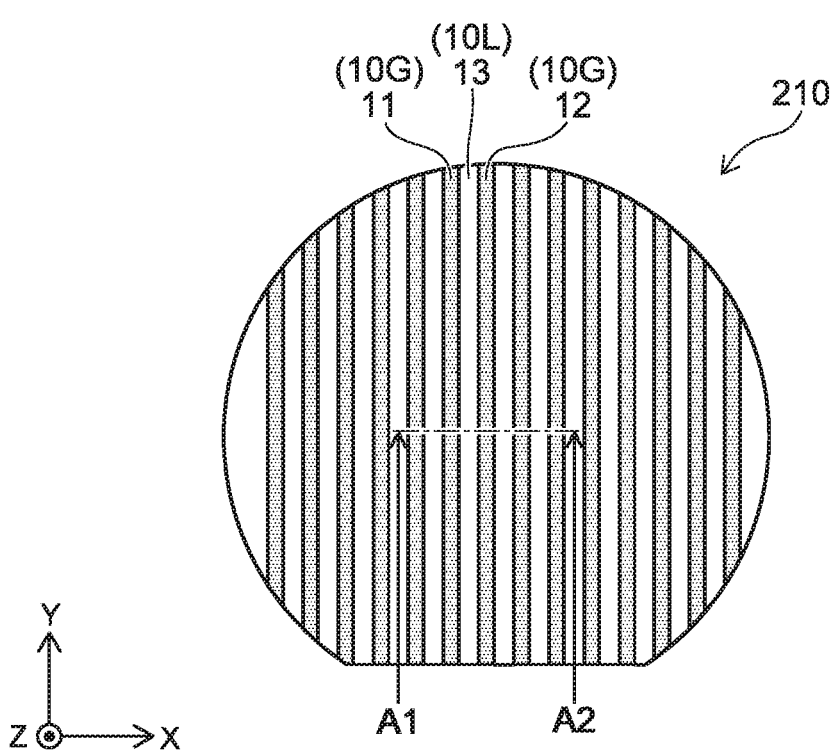

FIG. 1A and FIG. 1B are schematic views illustrating a substrate and a semiconductor device according to the first embodiment.

FIG. 1A is a line A1-A2 cross-sectional view of FIG. 1B. FIG. 1B is a plan view as viewed along arrow AR of FIG. 1A.

The substrate 210 shown in these drawings is a portion of the semiconductor device 110. Multiple portions that are used to form the semiconductor devices are formed using the substrate 210. The semiconductor devices 110 are obtained by subdividing the multiple portions. The substrate 210 includes silicon carbide (SiC). The semiconductor device 110 is based on silicon carbide.

As shown in FIG. 1A and FIG. 1B, the substrate 210 (and the semiconductor device 110) according to the embodiment include a first semiconductor region 10 and a second semiconductor region 20. The first semiconductor region 10 includes a compound (a first compound) including silicon and carbon. The first compound is, for example, SiC. The second semiconductor region 20 includes a compound (a second compound) including silicon and carbon. The second compound is, for example, SiC.

The first semiconductor region 10 is, for example, a SiC substrate. The first semiconductor region 10 is, for example, a SiC bulk single-crystal substrate. The first compound is, for example, 4H-SiC.

For example, the second semiconductor region 20 is used to form at least a portion of a drift layer.

The first semiconductor region 10 includes first to third regions 11 to 13. For example, the first to third regions 11 to 13 substantially contact the second semiconductor region 20.

For example, the first semiconductor region 10 has a first surface 10a. The first surface 10a is, for example, the upper surface of the substrate. The first to third regions 11 to 13 recited above are provided at the first surface 10a. The second semiconductor region 20 is formed by epitaxial growth on the first surface 10a.

The third region 13 is positioned between the first region 11 and the second region 12. The first region 11 and the second region 12 include germanium (Ge). The third region 13 does not include germanium. Or, the concentration (e.g., a third peak concentration) of germanium in the third region 13 is lower than the concentration (e.g., a first peak concentration) of germanium in the first region 11 and lower than the concentration (e.g., a second peak concentration) of germanium in the second region 12.

Thus, multiple Ge-including regions 10G that include germanium are provided at the vicinity of the first surface 10a. A region (a non-Ge-including region 10L) that is between the multiple Ge-including regions 10G substantially does not include Ge.

One of the multiple Ge-including regions 10G corresponds to the first region 11. Another one of the multiple Ge-including regions 10G corresponds to the second region 12. The non-Ge-including region 10L corresponds to the third region 13.

A direction (e.g., the stacking direction) from the first semiconductor region 10 toward the second semiconductor region 20 is taken as a first direction. The first direction is taken as a Z-axis direction. One direction perpendicular to the Z-axis direction is taken as an X-axis direction. A direction perpendicular to the Z-axis direction and the X-axis direction is taken as a Y-axis direction.

The direction from the first region 11 toward the second region 12 is taken as a second direction. The second direction crosses the first direction (the Z-axis direction). In the example, the second direction corresponds to the X-axis direction. The second region 12 is separated from the first region 11 in the X-axis direction (the second direction).

In the example as shown in FIG. 1B, the multiple Ge-including regions 10G (e.g., the first region 11, the second region 12, etc.) extend along the Y-axis direction. As described below, at least a portion of the multiple Ge-including regions 10G may have island configurations. At least a portion of the non-Ge-including regions 10L may have island configurations.

In the example as shown in FIG. 1A, the first semiconductor region 10 further includes a fourth region 14. The first to third regions 11 to 13 are positioned between the fourth region 14 and the second semiconductor region 20. The fourth region 14 does not include germanium. Or, the concentration (e.g., a fourth peak concentration) of germanium in the fourth region 14 is lower than the concentration (e.g., the first peak concentration) of germanium in the first region 11 and lower than the concentration (e.g., the second peak concentration) of germanium in the second region 12. The fourth region 14 corresponds to a non-Ge-including region 10M.

For example, the multiple Ge-including regions 10G recited above can be formed by introducing germanium into multiple portions of the surface of a SiC layer (a SiC substrate, etc.) used to form the first semiconductor region 10. As described below, multiple portions of a SiC layer may be removed; and a layer of a compound including silicon, carbon, and germanium may be formed in the removed region. Thereby, the multiple Ge-including regions 10G are formed.

Thus, the Ge-including region 10G and the non-Ge-including region 10L are provided in the embodiment. For example, the lattice constant of the Ge-including region 10G is larger than the lattice constant of the non-Ge-including region 10L. For example, a force (stress) is applied from the Ge-including region 10G to the non-Ge-including region 10L.

A reference example may be considered in which SiC including Ge is provided in the entire surface of a semiconductor region. In the reference example, misfit dislocations that are caused by the lattice constant difference occur easily in the basal planes. For example, there are cases where the starting points of stacking faults undesirably increase.

The Ge-including region 10G and the non-Ge-including region 10L are provided in the embodiment. For example, the Ge-including region 10G is provided as being subdivided. A large stress is obtained in the Ge-including region 10G. The occurrence of the misfit dislocations is suppressed because the Ge-including region 10G is provided as being subdivided. On the other hand, the atomic arrangement information that is necessary for epitaxial growth can be transferred to the second semiconductor region 20 from the non-Ge-including region 10L. Thereby, a high-quality crystal is obtained in the second semiconductor region 20.

In the embodiment, the non-Ge-including region 10L is subjected to compressive stress acting on the basal plane from the Ge-including region 10G. For example, a basal plane dislocation 10B that exists in the non-Ge-including region 10L (referring to FIG. 1A) is subjected to a mirror-image force. Thereby, transformation of the dislocation occurs from the front surface (the first surface 10a) toward the depth direction (the Z-axis direction). For example, the basal plane dislocation 10B (BPD (basal plane dislocation)) bends toward the front surface and becomes a threading edge dislocation TED (threading edge dislocation). For example, in the operation of the semiconductor device 110 (e.g., a power device), injected holes are suppressed from reaching the transformation point. Thereby, the recombination energy of electron-hole pairs that would cause the stacking faults to expand is not generated easily. Thereby, the expansion of the stacking faults is suppressed.

For example, in the embodiment, the basal plane dislocation 10B changes into a threading edge dislocation 10E in at least one of the third region 13 or the fourth region 14.

In the embodiment, a substrate and a semiconductor device can be provided in which the defects can be reduced.

For example, when a current that has a current density exceeding a threshold current density flows, stacking faults expand from partial dislocations which are at least a portion of the basal plane dislocations 10B. The threshold current density can be increased in the Ge-including regions 10G. For example, the Vf degradation can be suppressed.

In the embodiment, the basal plane dislocation density in the second semiconductor region 20 can be set to be lower than the basal plane dislocation density in the first semiconductor region 10. For example, the former is not more than $3/1000$ of the latter. For example, the former may be not more than $1/10000$ of the latter.

In one example according to the embodiment, for example, the first semiconductor region 10 and the second semiconductor region 20 are of an n-type. In such a case, the first semiconductor region 10 includes an element including at least one selected from the group consisting of nitrogen and phosphorus. The second semiconductor region 20 includes an element including at least one selected from the group consisting of nitrogen and phosphorus. These elements correspond to an n-type impurity. The concentration of the element recited above that is included in the first semiconductor region 10 is higher than the concentration of the element recited above that is included in the second semiconductor region 20.

For example, the concentration of the element (e.g., nitrogen) recited above that is in the first semiconductor region 10 is not less than $1 \times 10^{18}$ cm$^{-3}$ and not more than $1 \times 10^{19}$ cm$^{-3}$. The concentration of the element (e.g., nitrogen) recited above that is in the second semiconductor region 20 is not less than $1 \times 10^{16}$ cm$^{-3}$ and not more than $1 \times 10^{17}$ cm$^{-3}$. Such a difference of the concentrations is at least a portion of the information relating to the difference between these semiconductor regions.

As described below, the first semiconductor region 10 may include an element including at least one selected from the group consisting of aluminum and gallium. The element corresponds to a p-type impurity. In such a case, the second semiconductor region 20 includes an element including at least one selected from the group consisting of nitrogen and phosphorus. The element corresponds to the n-type impurity. Such a difference between the types of the elements is at least a portion of the information relating to the difference between these semiconductor regions.

Figure 2:
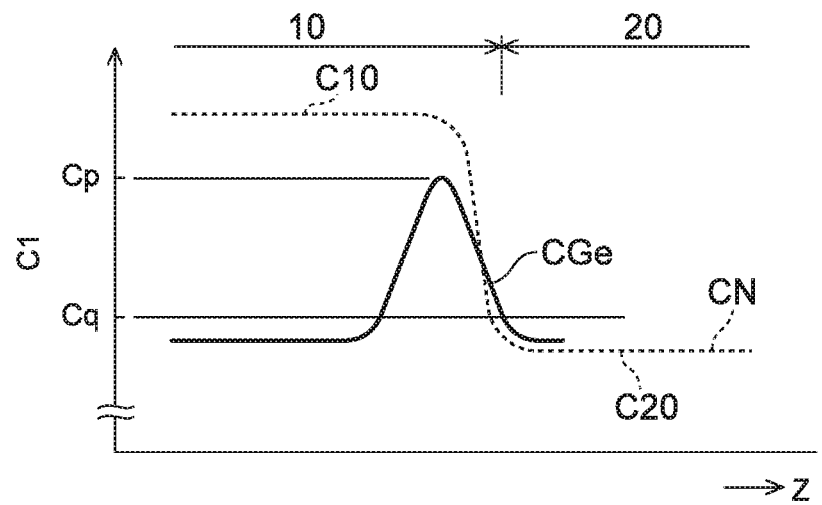
FIG. 2 is a graph illustrating the substrate and the semiconductor device according to the first embodiment.

FIG. 2 is a graph illustrating the substrate and the semiconductor device according to the first embodiment.

FIG. 2 illustrates the concentrations of the elements in a portion along line B1-B2 of FIG. 1A. The horizontal axis of FIG. 2 is the position in the thickness direction (the Z-axis direction). The vertical axis of FIG. 2 is a concentration Cl of the elements. In the example of FIG. 2, the first semiconductor region 10 and the second semiconductor region 20 include nitrogen. The profile of a concentration CN of nitrogen and the profile of a concentration CGe of germanium are illustrated in FIG. 2.

As shown in FIG. 2, a concentration C10 of nitrogen in the first semiconductor region 10 is higher than a concentration C20 of nitrogen in the second semiconductor region 20. In one example, the position where the concentration becomes $1/10$ of the concentration C10 (the peak concentration) of nitrogen in the first semiconductor region 10 can be taken to be the boundary between the first semiconductor region 10 and the second semiconductor region 20.

On the other hand, the profile of the concentration CGe of germanium has a distribution. For example, a peak Cp of the concentration CGe of germanium is positioned inside the first semiconductor region 10. A position where the concentration CGe (a concentration Cq) of germanium becomes $1/10$ of the peak Cp of the concentration CGe of germanium exists. This position may be positioned inside the second semiconductor region 20. For example, the concentration of germanium at a portion of the second semiconductor region 20 (the vicinity of the interface with the first region 11) may be not less than $1/10$ of the peak (the first peak concentration) of the concentration CGe of germanium in the first region 11.

For example, it is considered that a portion of the germanium included in the Ge-including region 10G moves inside the second semiconductor region 20. On the other hand, there may be a case where a portion of the germanium included in the Ge-including region 10G is observed to be positioned inside the second semiconductor region 20 according to the conditions of the analysis. Thus, the second semiconductor region 20 is positioned to substantially contact the Ge-including region 10G or to be exceedingly proximal to the Ge-including region 10G.

Thus, in the substrate 210 (and the semiconductor device 110) according to the embodiment, the first to third regions 11 to 13 are positioned between the fourth region 14 and the second semiconductor region 20. The second region 12 is separated from the first region 11 in a direction (e.g., the X-axis direction) crossing a direction (e.g., the Z-axis direction) from the fourth region 14 toward the second semiconductor region 20. The third region 13 is positioned between the first region 11 and the second region 12. The first region 11 and the second region 12 include germanium. On the other hand, the third region 13 does not include germanium. Or, the third peak concentration of germanium in the third region 13 is lower than the first peak concentration of germanium in the first region 11 and lower than the second peak concentration of germanium in the second region 12. The fourth region 14 does not include germanium. Or, the fourth peak concentration of germanium in the fourth region 14 is lower than the first peak concentration and lower than the second peak concentration. The concentration of germanium in a portion of the second semiconductor region 20 is $1/10$ of the first peak concentration or more.

According to such a substrate 210 and such a semiconductor device 110, a substrate and a semiconductor device can be provided in which the defects can be reduced.

Figure 3:
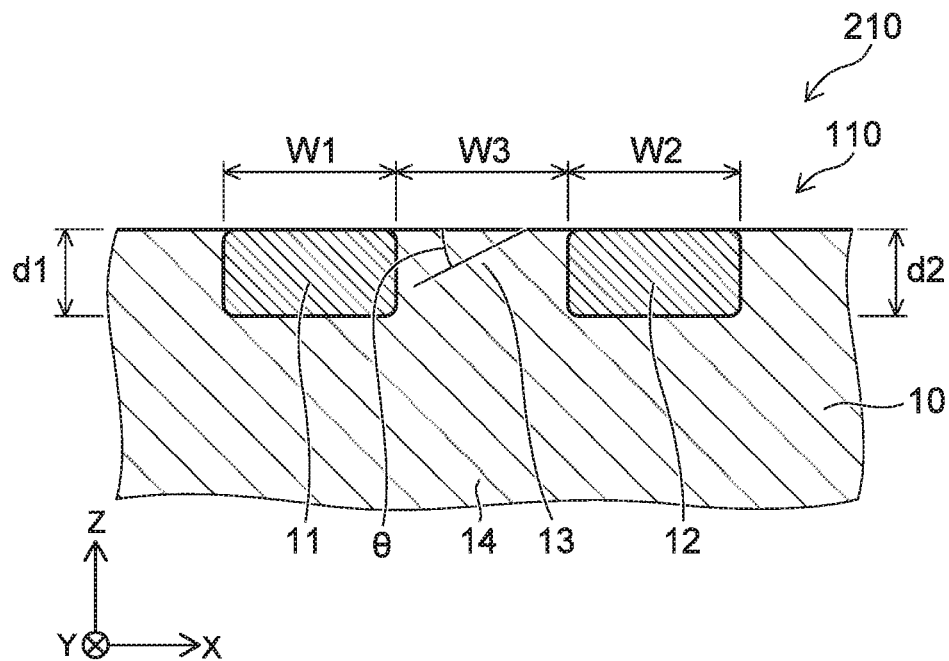
FIG. 3 is a schematic cross-sectional view illustrating the substrate and the semiconductor device according to the first embodiment.

FIG. 3 is a schematic cross-sectional view illustrating the substrate and the semiconductor device according to the first embodiment.

The angle between a <11-20> direction of the first compound (e.g., SiC) included in the first semiconductor region 10 and the direction (e.g., the X-axis direction) from the first region 11 toward the second region 12 is taken as an angle $\theta$. The angle $\theta$ is, for example, the off angle. The angle $\theta$ is, for example, not less than 0 degrees and not more than 10 degrees. The angle $\theta$ may be, for example, not less than 1 degree and not more than 5 degrees.

As shown in FIG. 3, the distance between the first region 11 and the second region 12 is taken as a distance w3. The distance w3 corresponds to the length along the X-axis direction of the third region 13. The length along the X-axis direction of the first region 11 is taken as a width w1. The length along the X-axis direction of the second region 12 is taken as a width w2.

In the embodiment, the width w1 is, for example, not less than 2 μm and not more than 50 μm. The width w2 is, for example, not less than 2 μm and not more than 50 μm. The distance w3 is, for example, not less than 1 μm and not more than 8 μm.

As shown in FIG. 3, a length d1 (the thickness) of the first region 11 and a length d2 (the thickness) of the second region 12 each are, for example, not less than 100 nm and not more than 600 nm. The length d1 is the length of the first region 11 along the direction (the Z-axis direction) from the first semiconductor region 10 toward the second semiconductor region 20. The length d2 is the length of the second region 12 along the Z-axis direction.

In the embodiment, it is favorable for the distance w3, the angle $\theta$, and the length d1 to satisfy the following first formula.

$$w3 < (d1/\tan \theta) \quad (1)$$

By such a relationship, for example, the basal plane dislocation 10B reaches the first region 11 or the second region 12. Thereby, the basal plane dislocation density can be transformed effectively.

It is favorable for the distance w3, the angle $\theta$, and the length d2 to satisfy the following second formula.

$$w3 < (d2/\tan \theta) \quad (2)$$

In the embodiment, the distance w3, the angle $\theta$, and the length d1 may satisfy the following third formula.

$$w3 < (d1/\tan \theta)/2 \quad (3)$$

The distance w3, the angle $\theta$, and the length d2 may satisfy the following fourth formula.

$$w3 < (d2/\tan \theta)/2 \quad (4)$$

For example, the basal plane dislocation density can be transformed effectively.

In the embodiment, the first region 11 includes $Si_{1-x1}Ge_{x1}C$. x1 is not less than 0.1 and not more than 0.2. The second region 12 includes $Si_{1-x2}Ge_{x2}C$. x2 is not less than 0.1 and not more than 0.2. x2 may be substantially the same as x1. In these regions, for example, Ge enters the sites of Si. For example, Si is replaced with Ge.

On the other hand, the third region 13 and the fourth region 14 substantially include SiC. The impurity that determines the conductivity type in the chemical formulas recited above is not included. The impurity includes, for example, at least one selected from the group consisting of nitrogen and phosphorus. Or, the impurity includes at least one selected from the group consisting of aluminum and gallium.

Figure 4:
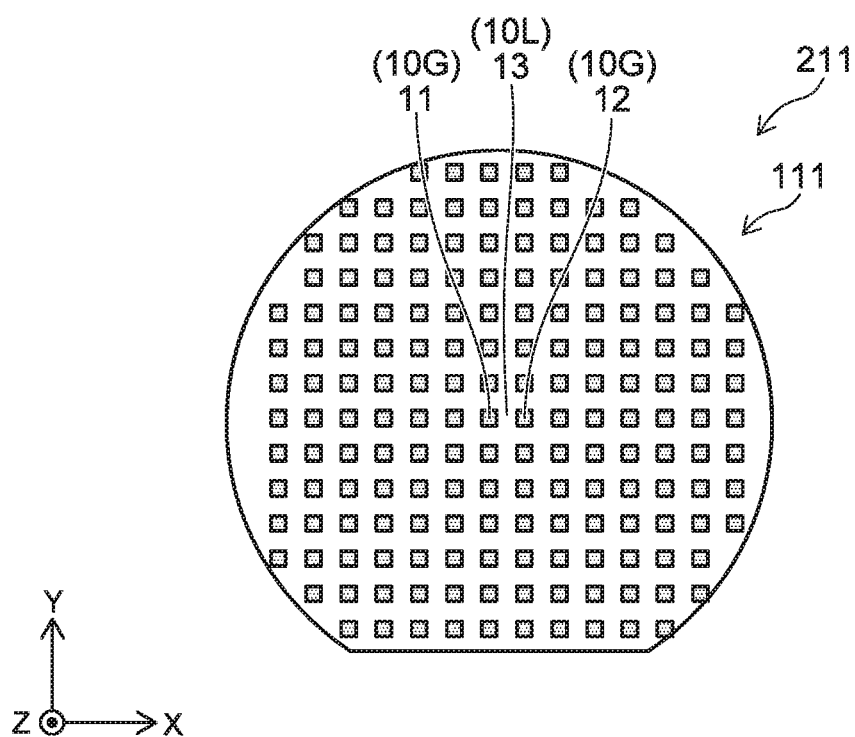
FIG. 4 is a schematic plan view illustrating substrates and semiconductor devices according to the first embodiment.
Figure 5:
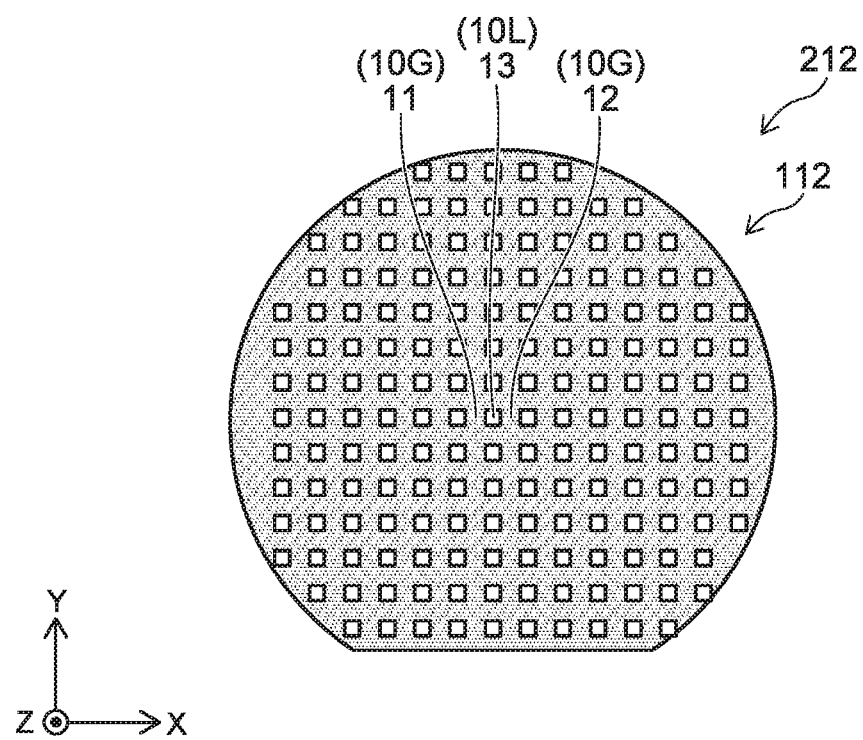
FIG. 5 is a schematic plan view illustrating substrates and semiconductor devices according to the first embodiment.

FIG. 4 and FIG. 5 are schematic plan views illustrating substrates and semiconductor devices according to the first embodiment.

In a substrate 211 and a semiconductor device 111 as shown in FIG. 4, the first region 11 and the second region 12 have island configurations. The third region 13 (a portion of the non-Ge-including region 10L) is positioned between the first regions 11 and the second regions 12. The non-Ge-including region 10L is provided around the first regions 11 and the second regions 12.

In a substrate 212 and a semiconductor device 112 as shown in FIG. 5, the third regions 13 (a portion of the non-Ge-including regions 10L) have island configurations. The Ge-including region 10G is provided around the non-Ge-including regions 10L. The third regions 13 (a portion of the non-Ge-including regions 10L) that have the island configurations are provided between the multiple portions (the first region 11 and the second region 12) included in the Ge-including region 10G.

Second Embodiment

A second embodiment relates to a semiconductor device. The semiconductor device is a transistor in the second embodiment.

Figure 6:
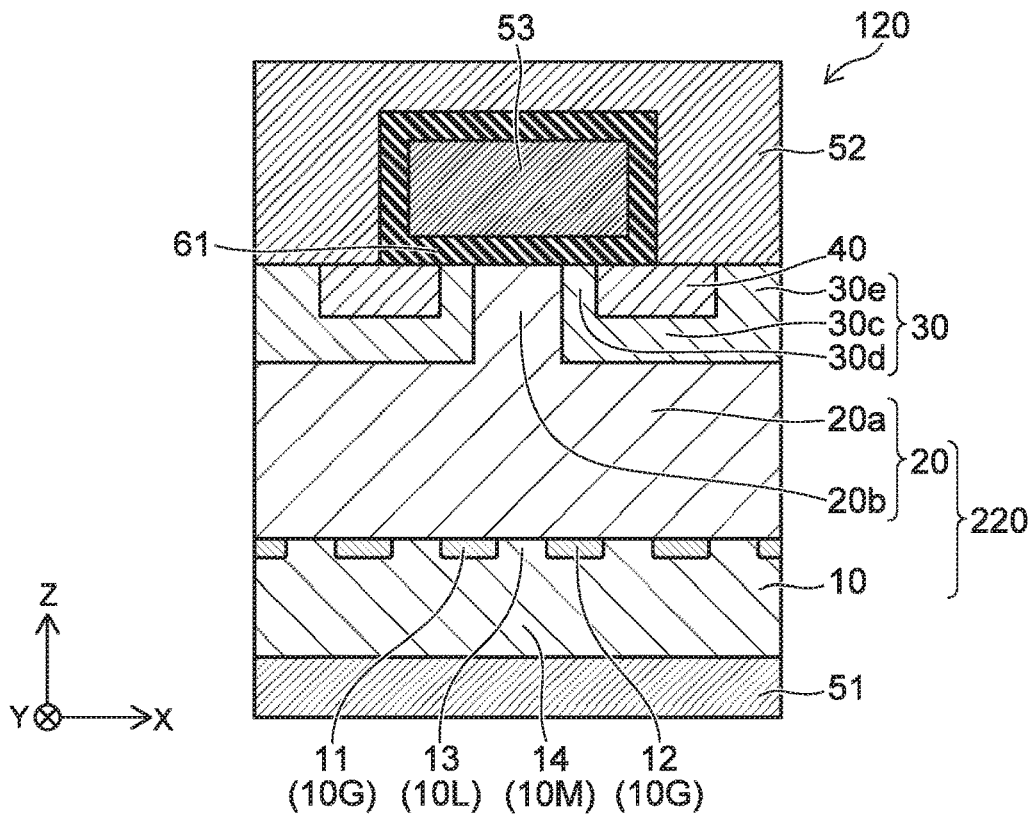
FIG. 6 is a schematic cross-sectional view illustrating a semiconductor device according to a second embodiment.

FIG. 6 is a schematic cross-sectional view illustrating the semiconductor device according to the second embodiment.

As shown in FIG. 6, the semiconductor device 120 according to the embodiment includes a third semiconductor region 30, a fourth semiconductor region 40, first to third electrodes 51 to 53, and the insulating portion 61 in addition to the first semiconductor region 10 and the second semiconductor region 20.

The second semiconductor region 20 is of a first conductivity type. The third semiconductor region 30 is of a second conductivity type. The fourth semiconductor region 40 is of the first conductivity type. For example, the first conductivity type is the n-type; and the second conductivity type is the p-type. The first conductivity type may be the p-type; and the second conductivity type may be the n-type. Hereinbelow, the first conductivity type is taken to be the n-type; and the second conductivity type is taken to be the p-type.

The first semiconductor region 10 is positioned in the first direction (the Z-axis direction) between the first electrode 51 and at least a portion of the second electrode 52 and between the first electrode 51 and the third electrode 53. The second region 12 is separated from the first region 11 in the second direction (e.g., the X-axis direction) crossing the first direction. The direction from the third electrode 53 toward the at least a portion of the second electrode 52 recited above is aligned with the second direction (e.g., the X-axis direction).

The second semiconductor region 20 includes a first portion 20a and a second portion 20b. The first portion 20a is positioned between the first semiconductor region 10 and the at least a portion of the second electrode 52 recited above in the first direction (the Z-axis direction). The second portion 20b is positioned between the first semiconductor region 10 and the third electrode 53 in the first direction (the Z-axis direction).

The third semiconductor region 30 includes a third portion 30c and a fourth portion 30d. The third portion 30c is positioned between the first portion 20a and the at least a portion of the second electrode 52 recited above in the first direction (the Z-axis direction). The third semiconductor region 30 further includes a fifth portion 30e in the example.

The fourth semiconductor region 40 is positioned between the third portion 30c and the at least a portion of the second electrode 52 recited above in the first direction (the Z-axis direction). The fourth semiconductor region 40 is electrically connected to the second electrode 52.

The fourth portion 30d of the third semiconductor region 30 is positioned between the fourth semiconductor region 40 and at least a portion of the second portion 20b of the second semiconductor region 20 in the second direction (e.g., the X-axis direction).

In the example, the fourth semiconductor region 40 is positioned between the third portion 30c and the fifth portion 30e in the X-axis direction. The fifth portion 30e is electrically connected to the second electrode 52.

The insulating portion 61 is positioned between the second portion 20b and the third electrode 53 in the first direction (the Z-axis direction). In the example, a portion of the insulating portion 61 is provided in the Z-axis direction also between the third electrode 53 and the fourth portion 30d and between the third electrode 53 and a portion of the fourth semiconductor region 40.

For example, the first electrode 51 corresponds to a drain electrode. For example, the second electrode 52 corresponds to a source electrode. For example, the third electrode 53 corresponds to a gate electrode. The first semiconductor region 10 is, for example, a SiC substrate. The first semiconductor region 10 is, for example, an n$^+$-region. For example, the second semiconductor region 20 corresponds to a drift layer. The second semiconductor region 20 is, for example, an n$^-$-region. For example, the third semiconductor region 30 corresponds to a p-well. For example, the fourth semiconductor region 40 corresponds to an n$^+$-source. The semiconductor device 120 is, for example, a MOSFET. The semiconductor device 120 is, for example, a vertical power MOSFET.

In the semiconductor device 120, for example, the first semiconductor region 10 includes an element including at least one selected from the group consisting of nitrogen and phosphorus. The second semiconductor region 20 includes an element including at least one selected from the group consisting of nitrogen and phosphorus. The concentration of the element recited above in the first semiconductor region 10 is higher than the concentration of the element recited above in the second semiconductor region 20. In the semiconductor device 120, for example, the Vf degradation can be suppressed.

The first semiconductor region 10 and the second semiconductor region 20 that are included in the semiconductor device 120 are a portion of a substrate 220 according to the embodiment.

Figure 7:
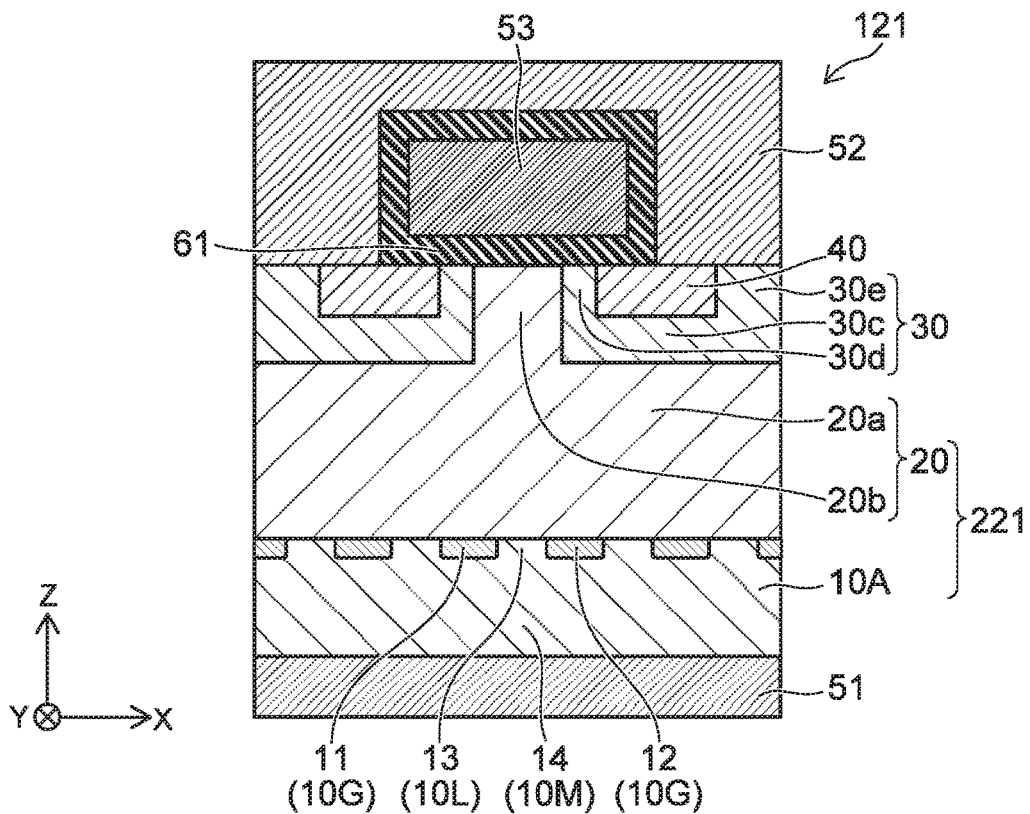
FIG. 7 is a schematic cross-sectional view illustrating a semiconductor device according to the second embodiment.

FIG. 7 is a schematic cross-sectional view illustrating a semiconductor device according to the second embodiment.

As shown in FIG. 7, the semiconductor device 121 according to the embodiment also includes the third semiconductor region 30, the fourth semiconductor region 40, the first to third electrodes 51 to 53, and the insulating portion 61 in addition to a first semiconductor region 10A and the second semiconductor region 20.

In the semiconductor device 121, the first semiconductor region 10A is of the p-type. Otherwise, the configuration of the semiconductor device 121 is similar to the configuration of the semiconductor device 120. The first to fourth regions 11 to 14 are provided also in the first semiconductor region 10A.

The first semiconductor region 10A includes an element including at least one selected from the group consisting of aluminum and gallium. The second semiconductor region 20 includes an element including at least one selected from the group consisting of nitrogen and phosphorus.

The semiconductor device 121 is, for example, an IGBT (Insulated Gate Bipolar Transistor). In the semiconductor device 121, for example, the Vf degradation can be suppressed.

The first semiconductor region 10A and the second semiconductor region 20 that are included in the semiconductor device 121 are a portion of a substrate 221 according to the embodiment.

In the embodiment, at least one of the first electrode 51 or the second electrode 52 includes, for example, at least one selected from the group consisting of Al, Cu, and Au. For example, the third electrode 53 (e.g., the gate electrode) includes at least one selected from the group consisting of TiN, Al, Ru, W, and TaSiN. The insulating portion 61 includes, for example, at least one selected from the group consisting of silicon oxide, silicon nitride, silicon oxynitride, aluminum oxide, and hafnium oxide.

Third Embodiment

A third embodiment relates to a semiconductor device. In the third embodiment, the semiconductor device is a diode.

Figure 8:
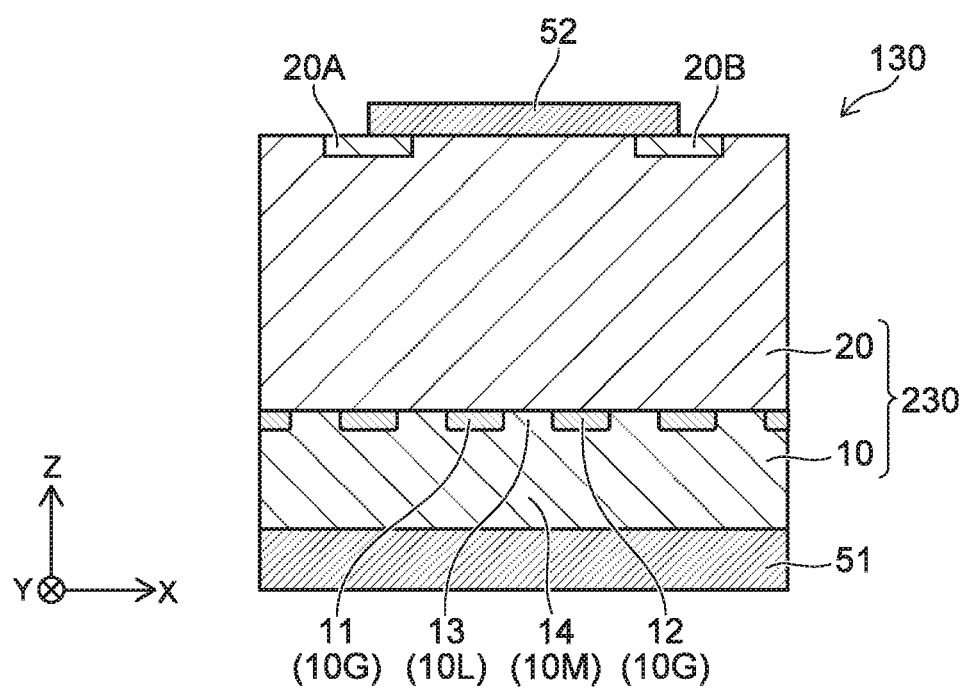
FIG. 8 is a schematic cross-sectional view illustrating a semiconductor device according to a third embodiment.

FIG. 8 is a schematic cross-sectional view illustrating the semiconductor device according to the third embodiment.

As shown in FIG. 8, the semiconductor device 130 according to the embodiment includes the first electrode 51 and the second electrode 52 in addition to the first semiconductor region 10 and the second semiconductor region 20.

The first semiconductor region 10 is positioned between the first electrode 51 and the second electrode 52. The second semiconductor region 20 is positioned between the first semiconductor region 10 and the second electrode 52.

For example, the first semiconductor region 10 is of the first conductivity type (e.g., the n-type); and the second semiconductor region 20 is of the first conductivity type. The impurity concentration of the first conductivity type in the first semiconductor region 10 is higher than the impurity concentration of the first conductivity type in the second semiconductor region 20. For example, the second electrode 52 has a Schottky junction with the second semiconductor region 20.

In the example, a junction terminal region 20A is provided between the second semiconductor region 20 and one end portion of the second electrode 52. A junction terminal region 20B is provided between the second semiconductor region 20 and another end portion of the second electrode 52.

The first electrode 51 is, for example, a cathode electrode. The second electrode 52 is, for example, an anode electrode. For example, the first semiconductor region 10 corresponds to an n$^+$-region (an n$^+$-substrate). For example, the second semiconductor region 20 corresponds to an n$^-$-region. For example, the second semiconductor region 20 corresponds to a drift layer. In the semiconductor device 130, for example, the Vf degradation can be suppressed.

The first semiconductor region 10 and the second semiconductor region 20 that are included in the semiconductor device 130 are a portion of a substrate 230 according to the embodiment.

Fourth Embodiment

A fourth embodiment relates to a method for manufacturing a semiconductor device or a substrate.

Figure 9A:
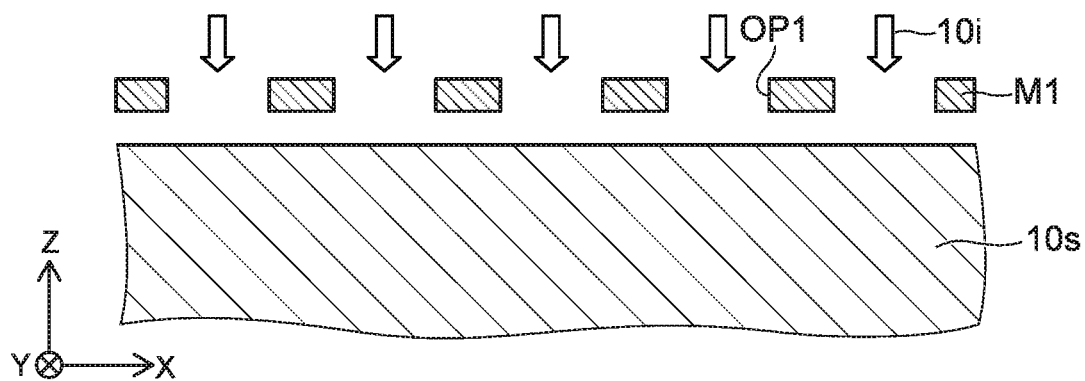
FIG. 9A to FIG. 9C are schematic cross-sectional views in order of the processes, illustrating a method for manufacturing the semiconductor device according to a fourth embodiment.
Figure 9B:
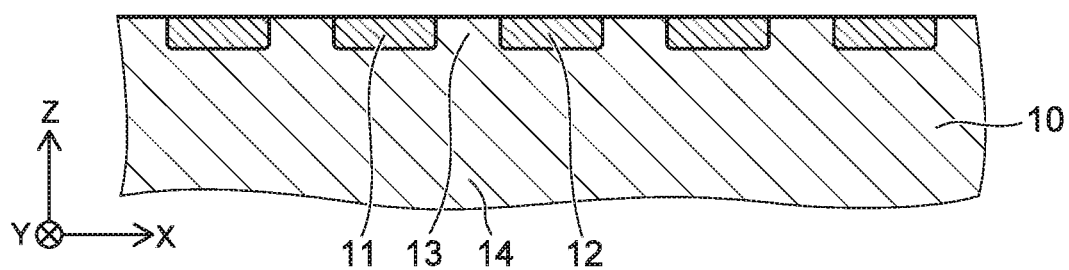
Figure 9C:
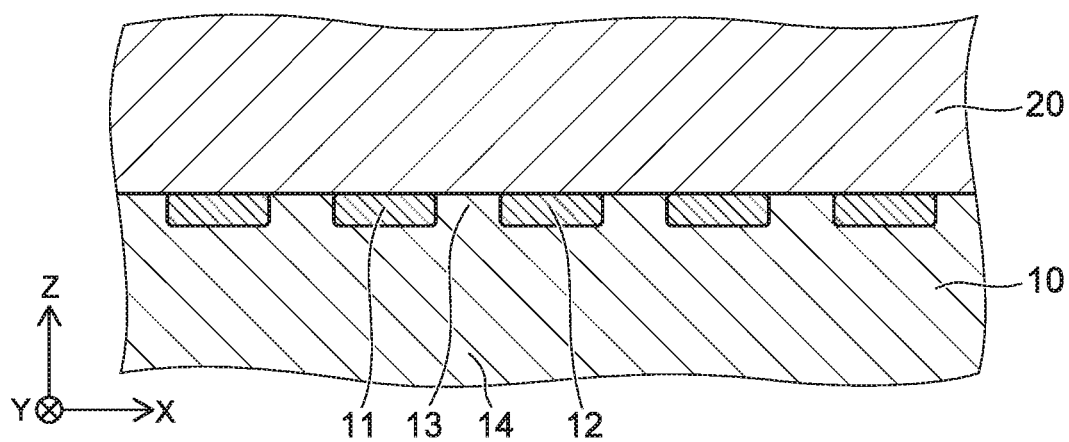

FIG. 9A to FIG. 9C are schematic cross-sectional views in order of the processes, illustrating the method for manufacturing the semiconductor device according to the fourth embodiment.

As shown in FIG. 9B, the method for manufacturing the semiconductor device includes a process of preparing the first semiconductor region 10. The first semiconductor region 10 includes the first compound (e.g., SiC) including silicon and carbon. The first semiconductor region 10 includes the first to third regions 11 to 13. The third region 13 is positioned between the first region 11 and the second region 12. The first region 11 and the second region 12 include germanium. The third region 13 does not include germanium. Or, the concentration (e.g., the third peak concentration) of germanium in the third region 13 is lower than the concentration (e.g., the first peak concentration) of germanium in the first region 11 and lower than the concentration (e.g., the second peak concentration) of germanium in the second region 12. In the example, the first to third regions 11 to 13 are positioned on the fourth region 14.

As shown in FIG. 9C, the second semiconductor region 20 is formed on the first to third regions 11 to 13. The second semiconductor region 20 includes the second compound (e.g., SiC) including silicon and carbon.

FIG. 9A shows an example of the process of preparing the first semiconductor region 10. The process of preparing the first semiconductor region 10 includes, for example, forming the first to third regions 11 to 13 by implanting germanium 10i into a portion of a base body 10s including the first compound. For example, the germanium 10i is implanted into the base body 10s by using a mask M1 having an opening OP1. Thereby, the germanium 10i is introduced selectively to the base body 10s.

FIG. 10A to FIG. 10D are schematic cross-sectional views in order of the processes, illustrating the method for manufacturing the semiconductor device according to the fourth embodiment.

Figure 10A:
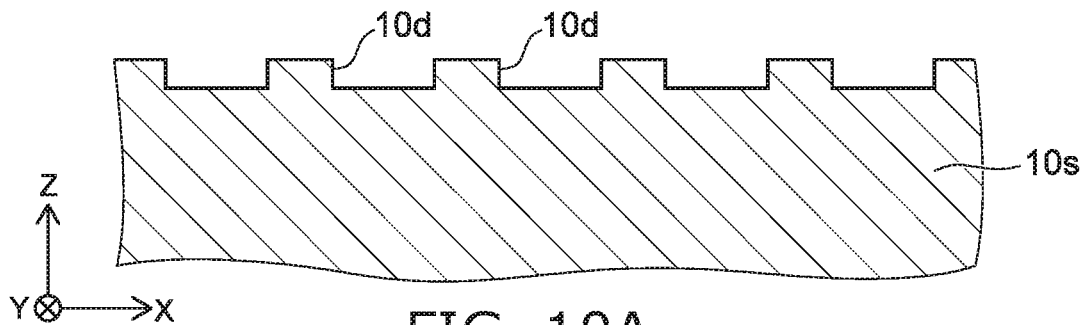
FIG. 10A to FIG. 10D are schematic cross-sectional views in order of the processes, illustrating a method for manufacturing the semiconductor device according to the fourth embodiment.
Figure 10B:
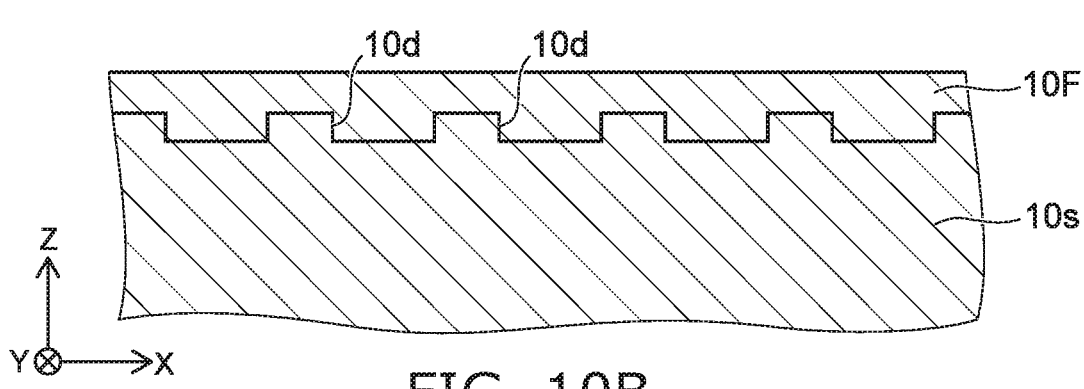
Figure 10C:
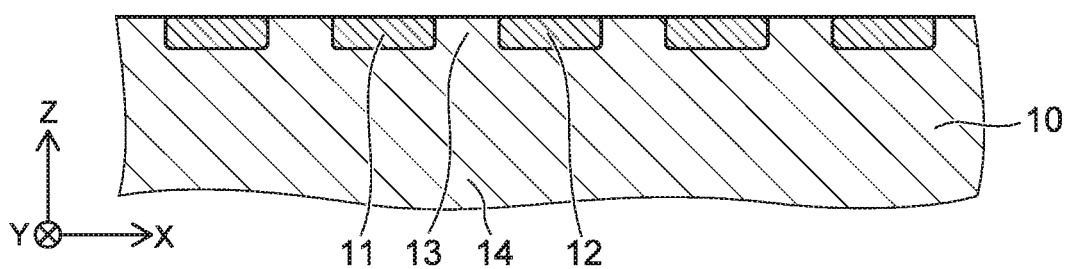
Figure 10D:
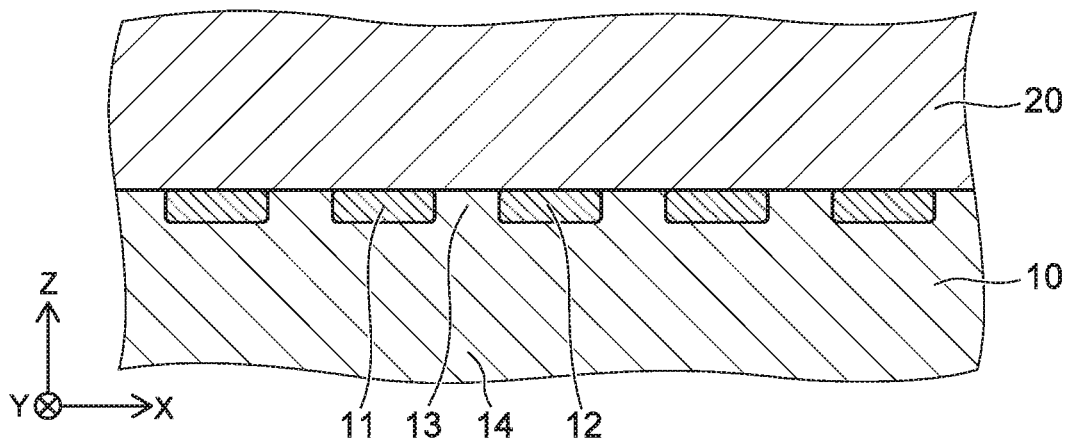

FIG. 10A and FIG. 10B show another example of the process of preparing the first semiconductor region 10.

As shown in FIG. 10A, multiple recesses 10d are formed in the base body 10s including the first compound (e.g., SiC). For example, RIE or the like is performed using a mask (not illustrated). The recesses 10d may be trenches.

As shown in FIG. 10B, a film 10F that includes silicon, carbon, and germanium is formed in the multiple recesses 10d. The film 10F includes, for example, $Si_{1-x1}Ge_{x1}C$. x1 is not less than 0.1 and not more than 0.2. For example, the film 10F can be formed by epitaxial growth. After the formation of the film 10F, for example, a portion of the film 10F is removed by CMP, etc. Thereby, the first to third regions 11 to 13 illustrated in FIG. 10C can be formed. Subsequently, the second semiconductor region 20 is formed on the first to third regions 11 to 13.

Thus, the substrate according to the embodiment is obtained.

Thus, the third semiconductor region 30, the fourth semiconductor region 40, etc., are formed in the second semiconductor region 20 that is obtained. Electrodes also are formed. Thereby, the semiconductor device (the transistor, the diode, or the like) according to the embodiment is obtained.

In the embodiments, for example, a region that includes Ge is formed selectively in a bulk substrate including SiC. Thereby, the threshold current density at which stacking faults occur in the region including Ge can be increased by the increase of the internal stress. On the other hand, in the region where Ge substantially is not included, the elastic strain of the region including Ge is absorbed as a compressive force acting on the basal planes. As a result, the basal plane dislocation 10B in the region not including Ge transforms into the threading edge dislocation 10E by a mirror-image force at a high temperature directly before the epitaxial growth of the second semiconductor region 20. For example, when applying a current, the injected holes are suppressed from reaching the basal plane dislocation 10B. For example, the expansion of the stacking faults is suppressed. For example, the Vf degradation is suppressed.

According to the embodiments, a semiconductor device, a substrate, a method for manufacturing a semiconductor device, and a method for manufacturing a substrate can be provided in which the defects can be reduced.

In the embodiment, the information that relates to the impurity concentration is obtained by, for example, SIMS (Secondary Ion Mass Spectrometry), etc. In the description recited above, the impurity concentration may be, for example, the carrier concentration.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor regions, electrodes, insulating portions, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices, substrates, methods for manufacturing semiconductor devices, and methods for manufacturing substrates practicable by an appropriate design modification by one skilled in the art based on the semiconductor devices, the substrates, the methods for manufacturing semiconductor devices, and the methods for manufacturing substrates described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first semiconductor region including a first compound including silicon and carbon; and
a second semiconductor region including a second compound including silicon and carbon,
the first semiconductor region including first to third regions contacting the second semiconductor region,
the third region being positioned between the first region and the second region,
the first region and the second region including germanium,
the third region not including germanium, or a concentration of germanium in the third region being lower than a concentration of germanium in the first region and lower than a concentration of germanium in the second region,
wherein
a distance w3 between the first region and the second region,
an angle θ between a <11-20> direction of the first compound and a direction from the first region toward the second region, and
a length d1 of the first region along a direction from the first semiconductor region toward the second semiconductor region satisfy $$w3 < (d1/\tan θ).$$

2. The device according to claim 1, wherein
the first semiconductor region further includes a fourth region,
the first to third regions are positioned between the fourth region and the second semiconductor region, and
the fourth region does not include germanium, or a concentration of germanium in the fourth region is lower than the concentration of germanium in the first region and lower than the concentration of germanium in the second region.

3. The device according to claim 1, wherein the distance w3, the angle θ, and the length d1 satisfy $$w3 < (d1/\tan θ)/2.$$

4. The device according to claim 1, further comprising:
a first electrode; and
a second electrode,
the first semiconductor region being positioned between the first electrode and the second electrode,
the second semiconductor region being positioned between the first semiconductor region and the second electrode,
the first semiconductor region being of a first conductivity type,
the second semiconductor region being of the first conductivity type,
an impurity concentration of the first conductivity type in the first semiconductor region being higher than an impurity concentration of the first conductivity type in the second semiconductor region.

5. The device according to claim 1, wherein
the first semiconductor region includes an element including at least one selected from the group consisting of nitrogen and phosphorus,
the second semiconductor region includes an element including at least one selected from the group consisting of nitrogen and phosphorus, and
a concentration of the element included in the first semiconductor region is higher than a concentration of the element included in the second semiconductor region.

6. The device according to claim 1, wherein
the first region includes $Si_{1-x1}Ge_{x1}C$, x1 being not less than 0.1 and not more than 0.2, and
the second region includes $Si_{1-x2}Ge_{x2}C$, x2 being not less than 0.1 and not more than 0.2.

7. A semiconductor device, comprising:
a first semiconductor region including a first compound including silicon and carbon;
a second semiconductor region including a second compound including silicon and carbon;
first to third electrodes;
a third semiconductor region;
a fourth semiconductor region; and
an insulating portion,
the first semiconductor region including first to third regions contacting the second semiconductor region,
the third region being positioned between the first region and the second region,
the first region and the second region including germanium,
the third region not including germanium, or a concentration of germanium in the third region being lower than a concentration of germanium in the first region and lower than a concentration of germanium in the second region,
the first semiconductor region being positioned in a first direction between the first electrode and at least a portion of the second electrode and between the first electrode and the third electrode, the second region being separated from the first region in a second direction crossing the first direction, a direction from the third electrode toward the at least a portion of the second electrode being aligned with the second direction, the second semiconductor region including a first portion and a second portion, the first portion being positioned between the first semiconductor region and the at least a portion of the second electrode in the first direction, the second portion being positioned between the first semiconductor region and the third electrode in the first direction, the third semiconductor region including a third portion and a fourth portion, the third portion being positioned between the first portion and the at least a portion of the second electrode in the first direction, the fourth semiconductor region being electrically connected to the second electrode and positioned between the third portion and the at least a portion of the second electrode in the first direction, the fourth portion being positioned between the fourth semiconductor region and at least a portion of the second portion in the second direction, the insulating portion being positioned between the second portion and the third electrode in the first direction, the second semiconductor region being of a first conductivity type, the third semiconductor region being of a second conductivity type, the fourth semiconductor region being of the first conductivity type.

8. A semiconductor device, comprising:

a first semiconductor region including a first compound including silicon and carbon; and a second semiconductor region including a second compound including silicon and carbon;

the first semiconductor region including first to third regions contacting the second semiconductor region, the third region being positioned between the first region and the second region, the first region and the second region including germanium, the third region not including germanium, or a concentration of germanium in the third region being lower than a concentration of germanium in the first region and lower than a concentration of germanium in the second region, wherein the first semiconductor region includes an element including at least one selected from the group consisting of aluminum and gallium, and the second semiconductor region includes an element including at least one selected from the group consisting of nitrogen and phosphorus.

9. A semiconductor device, comprising:

a first semiconductor region including a first compound including silicon and carbon; and a second semiconductor region including a second compound including silicon and carbon;

the first semiconductor region including first to third regions contacting the second semiconductor region, the third region being positioned between the first region and the second region, the first region and the second region including germanium, the third region not including germanium, or a concentration of germanium in the third region being lower than a concentration of germanium in the first region and lower than a concentration of germanium in the second region, wherein a basal plane dislocation density in the second semiconductor region is not more than $3/1000$ of a basal plane dislocation density in the first semiconductor region.

10. A semiconductor device, comprising:

a first semiconductor region including a first compound including silicon and carbon; and a second semiconductor region including a second compound including silicon and carbon;

the first semiconductor region including first to third regions contacting the second semiconductor region, the third region being positioned between the first region and the second region, the first region and the second region including germanium, the third region not including germanium, or a concentration of germanium in the third region being lower than a concentration of germanium in the first region and lower than a concentration of germanium in the second region, wherein the first semiconductor region further includes a fourth region, the first to third regions are positioned between the fourth region and the second semiconductor region, and the fourth region does not include germanium, or a concentration of germanium in the fourth region is lower than the concentration of germanium in the first region and lower than the concentration of germanium in the second region, a basal plane dislocation changes into a threading edge dislocation in at least one of the fourth region or the third region.

11. A substrate, comprising:

a first semiconductor region including a first compound including silicon and carbon; and a second semiconductor region including a second compound including silicon and carbon, the first semiconductor region including first to third regions contacting the second semiconductor region, the third region being positioned between the first region and the second region, the first region and the second region including germanium, the third region not including germanium, or a concentration of germanium in the third region being lower than a concentration of germanium in the first region and lower than a concentration of germanium in the second region, wherein a distance w3 between the first region and the second region, an angle θ between a <11-20> direction of the first compound and a direction from the first region toward the second region, and a length d1 of the first region along a direction from the first semiconductor region toward the second semiconductor region satisfy $w3 < (d1/\tan \theta)$.

12. The substrate according to claim 11, wherein the first semiconductor region further includes a fourth region, the first to third regions are positioned between the fourth region and the second semiconductor region, and the fourth region does not include germanium, or a concentration of germanium in the fourth region is lower than the concentration of germanium in the first region and lower than the concentration of germanium in the second region.

\* \* \* \* \*